(12) United States Patent
Ogawa

(10) Patent No.: US 10,485,130 B2
(45) Date of Patent: Nov. 19, 2019

(54) SURFACE MOUNT TYPE DEVICE AND MANUFACTURING METHOD FOR THE SAME

(71) Applicant: NIHON DEMPA KOGYO CO., LTD., Tokyo (JP)

(72) Inventor: Masato Ogawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/919,229

(22) Filed: Mar. 13, 2018

(65) Prior Publication Data
US 2018/0270978 A1    Sep. 20, 2018

(30) Foreign Application Priority Data
Mar. 17, 2017   (JP) .................................. 2017-052211

(51) Int. Cl.
*H05K 7/14*    (2006.01)
*H05K 5/00*    (2006.01)

(52) U.S. Cl.
CPC ........... *H05K 7/1417* (2013.01); *H05K 5/006* (2013.01); *H05K 5/0091* (2013.01)

(58) Field of Classification Search
CPC .... H05K 7/1417; H05K 5/0091; H05K 5/006; H05K 1/185; H05K 2201/2009; H05K 2201/2018; H01L 21/4853; H01L 21/563
See application file for complete search history.

(56) References Cited

U.S. PATENT DOCUMENTS

| 5,763,824 | A  | * | 6/1998  | King ..................... H01L 23/552 174/374 |
| 6,079,099 | A  | * | 6/2000  | Uchida ................ H05K 3/3405 174/382 |
| 2010/0183181 | A1 | * | 7/2010  | Wang ................... H04R 19/005 381/361 |
| 2013/0342980 | A1 | * | 12/2013 | Ishikawa .............. H05K 7/1053 361/679.01 |

(Continued)

FOREIGN PATENT DOCUMENTS

| JP | 2001326291 | 11/2001 |
| JP | 2014003553 | 1/2014 |

OTHER PUBLICATIONS

Ogawa et al., "High stability miniature size OCXO using a SC-cut crystal resonator and simultaneous oscillations," Proceedings of 2017 Joint Conference of the European Frequency and Time Forum and IEEE International Frequency Control Symposium (EFTF/IFCS), Jul. 9-13, 2017, pp. 231-234.

*Primary Examiner* — Steven T Sawyer
*Assistant Examiner* — Sagar Shrestha
(74) *Attorney, Agent, or Firm* — JCIPRNET

(57) ABSTRACT

A surface mount type device includes: an electronic component, a main substrate on which the electronic component is mounted, a pedestal on which the main substrate is mounted, a lower substrate on which the pedestal is mounted, and a cover mounted on the lower substrate so as to cover the pedestal. The soldering pattern is soldered with the cover from a region where the cover is mounted to an inside of the lower substrate, on the lower substrate. The pedestal includes a cut-out portion in a side surface portion so as to form a space above the soldering pattern. The cover is secured to the soldering pattern by a solder formed in the space.

4 Claims, 3 Drawing Sheets

(56) References Cited

U.S. PATENT DOCUMENTS

| | | | | |
|---|---|---|---|---|
| 2014/0151105 A1* | 6/2014 | Kuwahara | ............ | H05K 3/3442 |
| | | | | 174/260 |
| 2015/0264842 A1* | 9/2015 | Song | .................... | H05K 9/0032 |
| | | | | 361/714 |
| 2017/0148718 A1* | 5/2017 | Morita | ..................... | H05K 1/11 |

* cited by examiner

SURFACE MOUNT TYPE DEVICE AND MANUFACTURING METHOD FOR THE SAME

CROSS-REFERENCE TO RELATED APPLICATIONS

This application is based on and claims priority under 35 U.S.C. § 119 to Japanese Patent Application No. 2017-052211, filed on Mar. 17, 2017, the entire content of which is incorporated herein by reference.

TECHNICAL FIELD

The disclosure relates to a surface mount type device, particularly relates: to a surface mount type device that enables a cover to be secured by soldering even for a small-sized device and enables a facilitated assemble process; and its manufacturing method.

DESCRIPTION OF THE RELATED ART

Description of Prior Art

A surface mount type device (Surface Mount Device: SMD) includes a surface mount type piezoelectric oscillator such as an oven controlled crystal oscillator (OCXO). There is known a conventional surface mount type piezoelectric oscillator that has a configuration as follows: a main substrate, where electronic components such as a crystal unit are mounted on the main substrate, is mounted on a pedestal; the pedestal is mounted on a lower substrate; and an entire module (a pedestal module) including the pedestal is covered by a cover (see Japanese Unexamined Patent Application Publication No. 2014-3553).

The pedestal includes a plurality of pins that electrically connect the main substrate to the lower substrate. In the lower substrate, electrodes that connect to the pins of the pedestal and a soldering pattern where the cover is to be soldered are formed. In mounting, the pins of the pedestal and the electrodes of the lower substrate are soldered to secure the lower substrate to the pedestal, and then the soldering pattern of the lower substrate and the cover are soldered to secure the lower substrate to the cover.

Then, in the conventional surface mount type device, in the lower substrate, the soldering pattern for the cover is formed outside a region where the pedestal is mounted. In recent years, in accordance with downsizing of products, a gap between a pedestal and a cover on a lower substrate becomes narrow, and this makes it impossible to ensure a space for soldering the cover and results in bonding the cover with an adhesive or similar material. Bonding with an adhesive is insufficient in strength compared to soldering.

Related Technique

As a prior art pertaining to a surface mount type device, there is Japanese Unexamined Patent Application Publication No. 2014-3553 "SURFACE MOUNT TYPE DEVICE" (NIHON DEMPA KOGYO CO., LTD.), and as a prior art pertaining to a soldering, there is Japanese Unexamined Patent Application Publication No. 2001-326291 "SEMI-CONDUCTOR ELEMENT MODULE AND SEMICONDUCTOR EQUIPMENT" (MITSUBISHI ELECTRIC CORPORATION).

Japanese Unexamined Patent Application Publication No. 2014-3553 discloses that a pin adapter (a pedestal) including a plurality of pins is secured to a base substrate (a lower substrate), distal ends of the pins are inserted into holes that are located in a main substrate (a main substrate), where electronic components are mounted, to secure the main substrate to the base substrate.

Japanese Unexamined Patent Application Publication No. 2001-326291 discloses a configuration that prevents a short circuit caused by solder flowing in between a package bottom surface and a substrate when a semiconductor element module is mounted on the substrate via through holes located in the substrate.

As described above, the conventional surface mount type device and its manufacturing method has a problem that bonding strength by bonding with an adhesive or similar material is insufficient because downsizing of products makes it impossible to ensure a space for soldering the cover.

The conventional surface mount type device has a problem that in mounting the pedestal module and the cover onto the lower substrate, a mounting process needs two steps and thus is complicated because the pedestal module is first soldered and then the cover is secured with an adhesive.

Japanese Unexamined Patent Application Publication No. 2014-3553 and Japanese Unexamined Patent Application Publication No. 2001-326291 do not disclose that a soldering pattern on a lower substrate is formed from a region, where a cover is mounted, to an inside of the lower substrate, and a cut-out portion that forms a space in a portion above the soldering pattern is formed, in a side surface portion of a pedestal.

A need thus exists for a surface mount type device and a method for manufacturing the surface mount type device which are not susceptible to the drawback mentioned above.

SUMMARY

According to a first aspect of this disclosure, there is provided a surface mount type device. The surface mount type device includes: an electronic component, a main substrate on which the electronic component is mounted, a pedestal on which the main substrate is mounted, a lower substrate on which the pedestal is mounted, and a cover mounted on the lower substrate so as to cover the pedestal. The soldering pattern is soldered with the cover from a region where the cover is mounted to an inside of the lower substrate, on the lower substrate. The pedestal includes a cut-out portion in a side surface portion so as to form a space above the soldering pattern. The cover is secured to the soldering pattern by a solder formed in the space.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

The following describes an embodiment of the disclosure by referring to the accompanying drawings.

Outline of Embodiment

A surface mount type device (the surface mount type device) according to the embodiment of the disclosure is a surface mount type device where a main substrate, where electronic components are mounted, is mounted on a pedestal, and the pedestal and a cover covering the pedestal are mounted on a lower substrate. The surface mount type device is configured as follows: a soldering pattern that is soldered with the cover is formed from a region, where the cover is mounted, to a region inside the lower substrate on the lower substrate; a cut-out portion that forms a space above the soldering pattern is located in a side surface portion of the pedestal; and the cover is secured to the soldering pattern by the solder formed in the space. Thus, this ensures securing a space for soldering the cover on the lower substrate to be secured with a sufficient strength, and ensures performing soldering of the pedestal and soldering of the cover in an identical process and facilitating a mounting process.

In a manufacturing method of the surface mount type device according to the embodiment of the disclosure, solder is applied on a metal pattern and the soldering pattern on the lower substrate, the pedestal is mounted such that the solder on the soldering pattern is positioned inside the space formed by the cut-out portion, and electrodes and pins, and the soldering pattern and the cover are simultaneously secured by reflowing the solder after mounting the cover onto the soldering pattern. Thus, this ensures performing soldering of the pedestal and soldering of the cover in an identical process and facilitating a mounting process.

Figure 1:
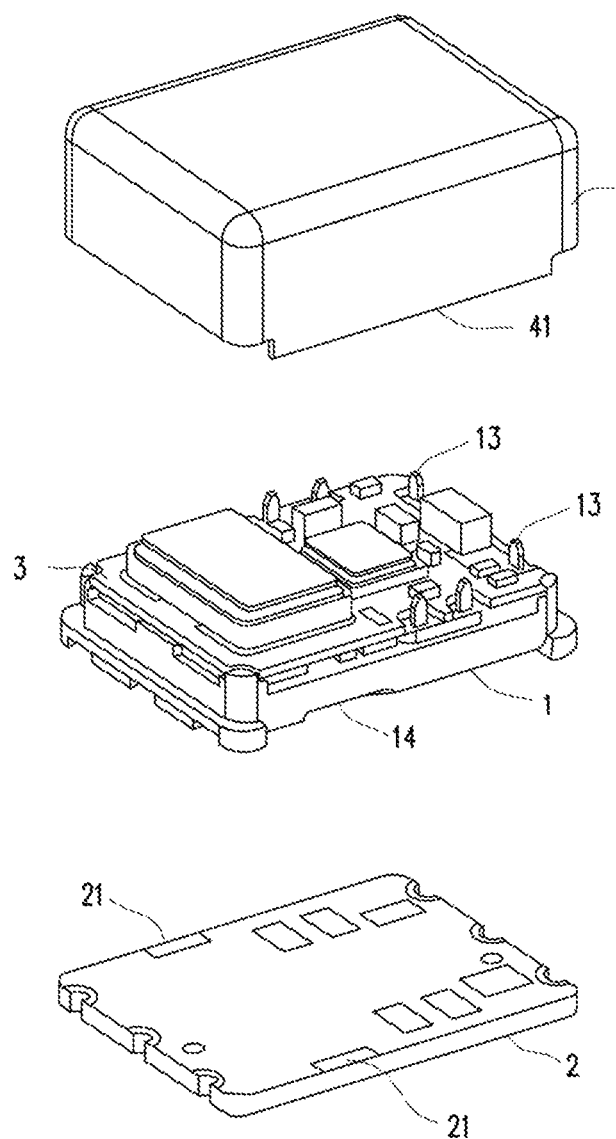
FIG. 1 is an exploded perspective view of a surface mount type device.

[Configuration of Surface Mount Type Device: FIG. 1]

The following describes the configuration of the surface mount type device by referring to FIG. 1. FIG. 1 is an exploded perspective view of the surface mount type device.

As illustrated in FIG. 1, the surface mount type device is, for example, an OCXO, and has a configuration where a pedestal 1 with a main substrate 3 mounted is mounted on a lower substrate 2, and further a cover 4 is located so as to cover the main substrate 3.

The main substrate 3 is mounted on the pedestal 1 in a state where electronic components such as a crystal unit and an oscillator circuit are mounted.

On a top surface of the lower substrate 2, a plurality of electrodes that are connected to pins of the pedestal 1 are formed, and soldering patterns 21 that are connected to long-side lower end portions 41 of the cover 4 are formed along long sides.

On a lower surface of the lower substrate 2, electrodes that are to be connected to a mounting substrate where the surface mount type device is mounted are located.

Here, the soldering patterns 21 are formed along the long sides of the lower substrate 2 and are formed up to portions that are inside from regions where the cover 4 is mounted and overlap with the pedestal 1 when the pedestal 1 is mounted.

Thus, in the surface mount type device, sufficiently securing widths (a short-side direction of the lower substrate 2) of the soldering patterns 21 by forming the soldering patterns 21 up to inside the regions where the pedestal 1 is mounted ensures soldering with the cover 4.

The pedestal 1 is a characterizing portion of the surface mount type device and includes cut-out portions 14 in its side surface portions.

The cut-out portions 14 are located in portions above the soldering patterns 21 when the pedestal 1 is mounted on the lower substrate 2, and form spaces (room) for forming sufficient amounts of solder on the soldering patterns 21.

That is, inside the spaces formed by the cut-out portions 14, solder is applied on the soldering patterns 21 and is bonded with the long-side lower end portions 41 of the cover 4.

The cover 4 is made of metal, and the long-side lower end portions 41 are soldered to the soldering patterns 21 on the lower substrate 2.

As illustrated in FIG. 1, short-side lower end portions of the cover 4 are mounted on short sides of the pedestal 1.

Figure 2:
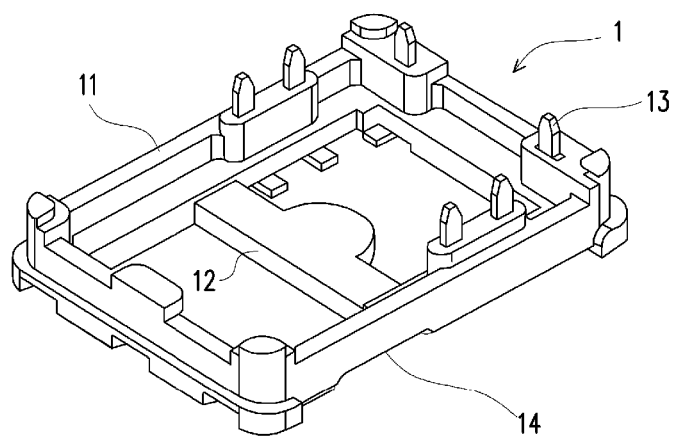
FIG. 2 is a perspective view illustrating a configuration of a pedestal of the surface mount type device.
Figure 3:
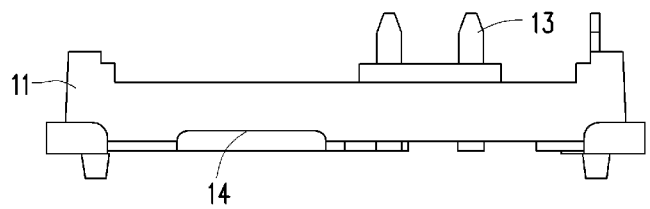
FIG. 3 is a side view of the pedestal of the surface mount type device.

[Pedestal 1 of Surface Mount Type Device: FIG. 2 and FIG. 3]

The following describes the pedestal 1 of the surface mount type device by referring to FIG. 2 and FIG. 3. FIG. 2 is a perspective view illustrating the configuration of the pedestal 1 of the surface mount type device, and FIG. 3 is a side view of the pedestal 1 of the surface mount type device.

As illustrated in FIG. 2 and FIG. 3, the pedestal 1 of the surface mount type device includes an outer frame portion 11 and a beam portion 12, which are formed of heat-resistant resin, and a plurality of pins 13 formed of conductive metal, and includes the cut-out portions 14 in the side surface portions of the outer frame portion 11.

The outer frame portion 11 is a portion constituting an outer shape of the pedestal 1 and includes the pins 13, which are inserted.

The beam portion 12 is formed so as to connect both the long sides of the outer frame portion 11 inside the outer frame portion 11, and increases strength of the pedestal 1 to prevent deformation caused by heat or an external force.

As illustrated in FIG. 2, the pins 13 have projected upper end portions that are inserted into the main substrate 3 mounted on the pedestal 1, and have lower end portions that have shapes bent inward and secured to the electrodes on the lower substrate 2 by soldering. That is, the pins 13 electrically connect the main substrate 3 to the lower substrate 2.

The pedestal 1 is integrally formed by pouring resin in a state where the plurality of pins 13 are inserted in a molding die.

The pedestal 1 includes the cut-out portions 14 in the side surface portions on the long-side sides. In FIG. 2, while only the cut-out portion 14 in the side surface on one long-side side is illustrated, the cut-out portion 14 is also formed at an opposite position on the other long side.

The cut-out portions 14 are formed in concave shapes that look like being partially hollowed out from the side surface portions to the bottom surface portions of the pedestal 1.

In particular, the cut-out portions 14 are formed at the positions that directly overlap above the soldering patterns 21 when the pedestal 1 is mounted on the lower substrate 2, and the spaces are formed by the cut-out portions 14 above the soldering patterns 21.

This enables the surface mount type device to have a special room for applying solder on the soldering patterns 21, and ensures connecting the lower substrate 2 to the cover 4 with sufficient strength by applying a sufficient amount of solder to mount the cover 4 and then securing the cover 4 to the soldering patterns 21 by reflow soldering.

In the surface mount type device, even the cut-out portions 14 are formed, the outer frame portion 11 of the pedestal 1 is connected over the entire outer peripheral portion, and thus ensures holding sufficient strength and preventing deformation caused by heat or an external force.

In particular, here, because the cut-out portions 14 are formed not to penetrate the side surface portions of the outer frame portion 11, this ensures sufficiently holding strength and preventing occurrence of failures by preventing solder from flowing in the region inside the outer frame portion 11.

It is possible that the cut-out portions 14 are formed to have shapes penetrating the side surface portions.

Figure 4:
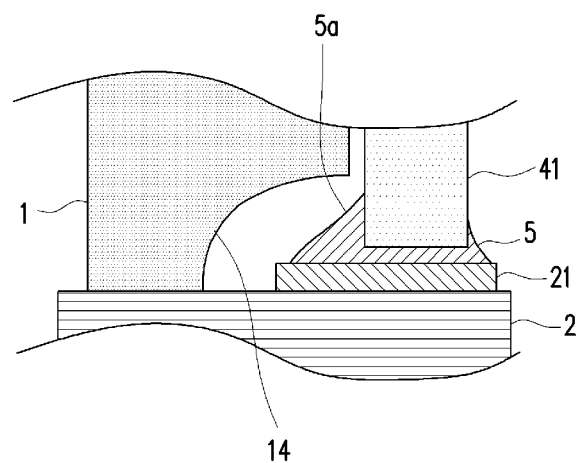
FIG. 4 is a cross-sectional explanatory view of a connecting portion between a cover and a lower substrate in the surface mount type device.

[Connecting Portion Between Cover 4 and Lower Substrate 2: FIG. 4]

Next, the following describes the connecting portion between the cover 4 and the lower substrate 2 by referring to FIG. 4. FIG. 4 is a cross-sectional explanatory view of the connecting portion between the cover 4 and the lower substrate 2 in the surface mount type device.

As illustrated in FIG. 4, in the surface mount type device, the pedestal 1 and the long-side lower end portions 41 of the cover 4 are mounted on the lower substrate 2.

In the pedestal 1, the cut-out portions 14 are formed such that the pedestal 1 is partially cut out from its side surface portions to its bottom surface portions.

The soldering pattern 21 is formed along the long side on the lower substrate 2. The soldering pattern 21 is formed to be extended into the inside (the left side) so as to enter the inside of the cut-out portion 14 of the pedestal 1, from the outside region (on the right side in FIG. 4) with respect to the pedestal 1, on the lower substrate 2.

This enables forming the soldering pattern 21 with a sufficient size and securing the space for applying solder. The soldering pattern 21 and the long-side lower end portion 41 of the cover 4 are bonded by solders 5.

In particular, in the surface mount type device, applying a sufficient amount of solder raises the solder that is in close contact with the side surface of the cover 4 to form fillets 5a after reflow soldering, and further improves the bonding between the soldering pattern 21 and the long-side lower end portion 41 of the cover 4.

As described above, since the cut-out portion 14 does not penetrate the side surface portion of the pedestal 1, the solder 5 does not expand into the inside region with respect to the pedestal 1 even when the solder 5 flows inward by reflow soldering.

[Manufacturing Method of Surface Mount Type Device: FIG. 1 to FIG. 4]

Next, the following describes the manufacturing method of the surface mount type device by referring to FIG. 1 to FIG. 4.

As illustrated in FIG. 1, the pedestal 1 that includes the plurality of pins 13 and the cut-out portions 14 in its side surface portions is formed, and then the main substrate 3 with a crystal unit, an oscillator circuit, and similar component mounted is mounted onto the pedestal 1.

The electrodes and the soldering patterns 21 are preliminarily formed on the top surface of the lower substrate 2, and the solders 5 are applied on the electrodes and the soldering patterns 21.

Then, the pedestal 1 is mounted onto the lower substrate 2 such that the electrodes of the lower substrate 2 and the pins 13 of the pedestal 1 are connected, and the cut-out portions 14 are positioned on the soldering patterns 21.

Then, the cover 4 is mounted onto the soldering patterns 21 of the lower substrate 2 to cover the pedestal 1 and the main substrate 3.

Subsequently, the electrodes of the lower substrate 2 and the pins 13 of the pedestal 1, and the soldering patterns 21 of the lower substrate 2 and the cover 4 are simultaneously bonded by performing the reflow soldering.

That is, in the surface mount type device, the soldering of the pedestal 1 and the soldering of the cover 4 can be performed by the identical process, and thus, this ensures a facilitated mounting (assembly) process and reduced manufacturing cost, compared with a case of bonding a cover by using an adhesive.

Effect of Embodiment

The surface mount type device according to the embodiment of the disclosure is a surface mount type device where the main substrate 3, where the electronic components are mounted, is mounted on the pedestal 1, and the pedestal 1 and the cover 4 covering the pedestal 1 are mounted on the lower substrate 2. The surface mount type device is configured as follows: the soldering patterns 21 soldered with the cover 4 are formed from the outside region to the inside region with respect to the cover 4, on the lower substrate 2; the cut-out portions 14 that form the spaces above the soldering patterns 21 are located in the side surface portions of the pedestal 1; and the cover 4 is secured to the soldering patterns 21 by the solders 5 formed in the spaces. Thus, even for a small-sized surface mount type device, this ensures forming the soldering patterns 21 on the lower substrate 2, securing spaces for soldering to secure the lower substrate 2 to the cover 4 with sufficient strength, and performing the soldering of the pedestal 1 and the soldering of the cover 4 with an identical process, and has an effect to ensure a facilitated mounting process.

The manufacturing method according to the embodiment of the disclosure ensures performing the soldering of the pedestal 1 and the soldering of the cover 4 with an identical process and ensures a facilitated mounting process, compared with a case of using an adhesive, and thus has an effect to ensure reduced manufacturing cost.

With surface mount type device, since the cut-out portions 14 of the pedestal 1 do not penetrate the side surface portions, the surface mount type device has an effect to prevent the solders 5 from flowing in inward by reflow soldering and to ensure prevention of a short circuit.

With surface mount type device, since the side surface portions of the pedestal 1 are continuously formed without being cut, the surface mount type device has an effect to hold strength of the main body of the pedestal 1 and to ensure preventing deformation cause by heat or an external force.

The disclosure is suitable for a surface mount type device and its manufacturing method that ensure securing a cover by soldering even for a small-sized device and ensure a facilitated assembly process.

A surface mount type device according to a first aspect of this disclosure includes a pedestal where a main substrate where an electronic component is mounted is mounted, a lower substrate where the pedestal is mounted, a cover mounted on the lower substrate so as to cover the pedestal, and a soldering pattern soldered with the cover from a region where the cover is mounted to an inside of the lower substrate. The pedestal includes a cut-out portion in a side surface portion so as to form a space above the soldering pattern. The cover is secured to the soldering pattern by a solder formed in the space.

In the surface mount type device according to the first aspect of this disclosure, the cut-out portion may have a concave shape where a part of the side surface portion is cut out from an outer side surface to a bottom portion of the side surface portion.

In the surface mount type device according to the first aspect of this disclosure, the pedestal may include a plurality of pins that electrically connect the lower substrate to the main substrate, and the plurality of pins are secured to electrodes formed on the lower substrate by solder.

A method for manufacturing a surface mount type device according to a second aspect of the disclosure by mounting a pedestal and a cover onto a lower substrate includes: a step of mounting a main substrate, where an electronic component is mounted, onto the pedestal that includes a cut-out portion on a side surface portion and a plurality of pins; a step of applying a solder to electrodes formed on the lower substrate and to a soldering pattern formed from a region where the cover is mounted to an inside of the lower substrate; a step of mounting the pedestal such that the solder on the soldering pattern is positioned inside a space formed by the cut-out portion; a step of mounting the cover onto the soldering pattern; and a step of securing the electrodes to the pins, and securing the soldering pattern to the cover simultaneously by reflowing the solder.

With the disclosure, the surface mount type device includes the pedestal where the main substrate, where an electronic component is mounted, is mounted, the lower substrate where the pedestal is mounted, and the cover mounted on the lower substrate so as to cover the pedestal. The soldering pattern soldered with the cover from a region where the cover is mounted to an inside of the lower substrate; the pedestal includes a cut-out portion in its side surface portion so as to form a space above the soldering pattern; and the cover is secured to the soldering pattern by the solder formed in the space. This ensures improving strength of bonding compared with a case of using an adhesive even for a small-sized device because the lower substrate and the cover are solderable by application of a sufficient amount of solder to the soldering pattern with a sufficient size inside the space formed by the cut-out portion and ensures a facilitated assembly process because the pedestal and the cover are solderable in an identical process.

With the disclosure, the method for manufacturing the surface mount type device by mounting the pedestal and the cover onto the lower substrate includes the following steps: a step of mounting the main substrate, where an electronic component is mounted, onto the pedestal that includes the cut-out portion on its side surface portion and the plurality of pins; a step of applying a solder to electrodes formed on the lower substrate and to the soldering pattern formed from the region where the cover is mounted to the inside of the lower substrate; a step of mounting the pedestal such that the solder on the soldering pattern is positioned inside the space formed by the cut-out portion; a step of mounting the cover onto the soldering pattern; and a step of securing the electrodes to the pins, and securing the soldering pattern to the cover simultaneously by reflowing the solder. This ensures improving strength of bonding compared to the case of bonding the lower substrate and the cover by an adhesive and ensures a facilitated assembly process and reduced manufacturing cost because the pedestal and the cover are solderable in an identical process.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface mount type device, comprising:
   an electronic component;
   a main substrate on which the electronic component is mounted;
   a pedestal on which the main substrate is mounted, wherein the pedestal has an outer frame portion and a beam portion which connects two long sides of the outer frame portion;
   a lower substrate on which the pedestal is mounted;
   a cover mounted on the lower substrate so as to cover the pedestal, wherein
   a soldering pattern soldered with the cover from a region where the cover is mounted to an inside of the lower substrate, on the lower substrate; and
   the pedestal includes a cut-out portion disposed in a side surface portion of the outer frame portion so as to form a space above the soldering pattern, the cut-out portion is configured not to penetrate the side surface portion of the outer frame portion, and the soldering pattern extends from a region outside of the pedestal to the space formed by the cut-out portion, and
   the cover is secured to the soldering pattern by a solder formed in the space.

2. The surface mount type device according to claim 1, wherein
   the cut-out portion has a concave shape where the side surface portion is partially cut out from an outer side surface to a bottom portion of the side surface portion.

3. The surface mount type device according to claim 1, wherein
   the pedestal includes a plurality of pins that electrically connect the lower substrate to the main substrate, and
   the plurality of pins are secured to electrodes formed on the lower substrate by solder.

4. A method for manufacturing the surface mount type device according to claim 1 by mounting the pedestal and the cover onto the lower substrate, comprising:
   mounting the main substrate where the electronic component is mounted onto the pedestal that includes the cut-out portion on the side surface portion and a plurality of pins;
   applying a solder to electrodes formed on the lower substrate and to the soldering pattern formed from the region where the cover is mounted to the inside of the lower substrate;
   mounting the pedestal such that the solder on the soldering pattern is positioned inside the space formed by the cut-out portion;
   mounting the cover onto the soldering pattern; and
   securing the electrodes to the pins, and securing the soldering pattern to the cover simultaneously by reflowing the solder.

* * * * *